United States Patent [19]
Barabas

[11] 4,331,950
[45] May 25, 1982

[54] BROAD BAND SWITCHING NETWORK

[75] Inventor: Udo Barabas, Munich, Fed. Rep. of Germany

[73] Assignee: Siemens Aktiengesellschaft, Berlin & Munich, Fed. Rep. of Germany

[21] Appl. No.: 203,977

[22] Filed: Nov. 4, 1980

[30] Foreign Application Priority Data

Nov. 6, 1979 [DE] Fed. Rep. of Germany ....... 2944794

[51] Int. Cl.³ .......................... H04N 5/22; H04Q 9/00
[52] U.S. Cl. .......................... 340/825.87; 179/18 GF; 358/181
[58] Field of Search .............. 340/166 R; 179/18 GF; 358/181

[56] References Cited

U.S. PATENT DOCUMENTS 4,274,112  6/1981  Leysieffer .......................... 358/181

FOREIGN PATENT DOCUMENTS 2828662  6/1979  Fed. Rep. of Germany .

OTHER PUBLICATIONS

Pfannschmidt, "Arbeitsgeschwindigkeitsgrenzen von Koppelnetzwerken für Breitband–Digitalsignale" Dissertation, Tech. Univ., Braunschweig, 1978, pp. 42–45.
Bauch, "Künftige Kommunikationstechnik mit Lichtleitern" ntz, vol. 32, (1979), No. 3, pp. 150–153.

Primary Examiner—Harold I. Pitts
Attorney, Agent, or Firm—Hill, Van Santen, Steadman, Chiara & Simpson

[57] ABSTRACT

In the exemplary embodiment, in order to reduce the load on the input signal sources, the individual inputs are respectively connected to the respectively appertaining coupling point switches via a fan-out arrangement of constantly unlocked ECL elements with a plurality of negating or, respectively, non-negating outputs. In order to take such negations into consideration, a respective half of the cross point switches are formed by means of AND gates and one respective half is formed by means of NOR gates.

2 Claims, 1 Drawing Figure

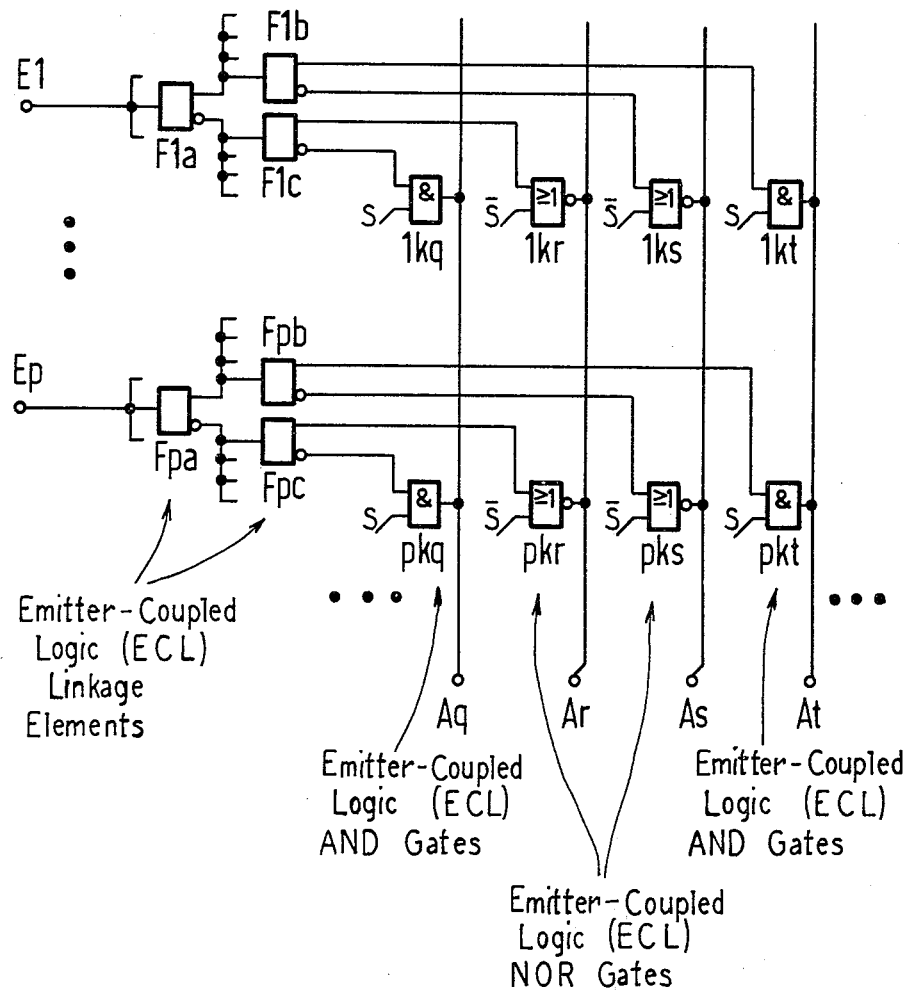

BROAD BAND SWITCHING NETWORK

BACKGROUND OF THE INVENTION

The invention relates to a switching network for selective through-connection of signals of high band width.

In such a broad band switching network, the cross point or coupling point circuits, whose function is to selectively connect input lines to output lines of the switching network can be formed by means of linkage elements realized in ECL technology, in view of the smallest possible switching times or, respectively, of the preferably pulse-modulated signals with signal frequencies, of, for example, up to more 80 MHz to be through-connected (cf. Pfannschmidt: "Arbeitsgeschwindigkeitsgrenzen von Koppelnetzwerken für Breitband-Digitalsignale", Dissertation, Technical University Braunschweig, 1978; German AS No. 2,828,662).

Given such a broad band switching network, television programs can be switched, for example, to subscribers who wish to receive such programs, as is involved in recent developments of telecommunications which lead to broad band communication networks with subscriber lines formed by means of light wave-guides, whereby a star network of light waveguides with one light waveguide per dwelling unit proves favorable at the subscriber level, said light waveguide connecting a broad band switching location (expediently spatially united with the nearest telephone switching location) to the dwelling of the subscriber and via which all telecommunication services for the appertaining dwelling unit are sequenced, whereby offering, for example, at least approximately the following communication possibilities comes into consideration for a dwelling terminal which does justice to future developments:

- three video channels for three video receivers with independent access to all television signal sources which can be reached by the switching location or, respectively, television programs which are available in the switching location,
- three return channels for program selection and, under certain conditions, for sequencing interactive services,
- as well as a greater number of VHF radio channels (stereo) (ntz, 32 (1979) 3, pages 150 through 153).

In such a broad band signal switching center, under certain conditions, a multitude of subscriber terminals must, on the one hand, be able to be connected simultaneously to one and the same broad band signal source, whereas, on the other hand, one must proceed therefrom that the individual broad band signal sources are not to be loaded too low impedance and are not to be loaded with circuit capacitances which are all too great, i.e., are not to be loaded with a randomly great number of directly connected cross point switches or, respectively, subscribers reached via these cross points switches; the invention reveals a way to do justice to this in an expedient manner.

SUMMARY OF THE INVENTION

The invention relates to a broad band switching network for pulse modulated broad band signals, with cross point or coupling point circuits in ECL technology; this broad band switching network is inventively characterized in that constantly unlocked ECL linkage elements with a plurality of outputs, with or, respectively, without negation, are provided for the connection of the individual inputs of the switching network to the cross point switches appertaining to the respective input and leading to the various outputs of the switching network whereby cross point switches in whose case the broad band signals have experienced $2n-2$ negations (with $n=1,2,\ldots$) in the said ECL linkage elements preconnected to the cross point switches in iterative network, on the one hand, and cross point switches in whose case the broad band signals have experienced $2n-1$ negations (with $n=1,2,\ldots$) in the said ECL linkage elements preconnected to the cross point switches in iterative network, on the other hand, are formed by means of ECL linkage elements with linkage functions which are interchanged with one another with respect to the pulse-modulated broad band signals, preferably by means of AND elements and by means of NOR elements.

The invention offers the advantage of a noticeable limitation of the circuit-technical outlay required in the broad band switching network for the connection of inputs or, respectively, the broad band signal sources connected thereto to the respectively appertaining cross point switches.

The invention is described in greater detail on the basis of the accompanying drawing sheet; and other objects, features and advantages will be apparent from this detailed disclosure and from the appended claims.

BRIEF DESCRIPTION OF THE DRAWING

The single FIGURE is an electric circuit diagram for illustrating an exemplary embodiment of the invention.

DETAILED DESCRIPTION

In a scope necessary for an understanding of the invention, the drawing schematically shows a broad band switching network whose individual input lines El . . . Ep are connectible via cross point switches . . . , 1kq, . . . , pkt, . . . to output lines . . . , Aq, . . . At, . . . and which, in particular, can find employment in a broad band switching system of the type described in further details which are perhaps of interest in the framework of the present invention in a related German application No. P 29 44 784.5 filed Nov. 6, 1979, and in the corresponding U.S. application for patent, serial No. 203980, filed Nov. 4, 1980, attorneys case No. P-80,1217, applicant ref. VPA 79 P 7812 USA.

Without this being illustrated in the drawing, thereby, broad band signal sources which, in particular, may be given by means of television program sources can lead to the inputs El . . . Ep and the outputs . . . , Aq, . . . , At, . . . can lead, for example, to subscriber dwelling terminals, as are revealed, for example, in the German application P 29 51 495.2 filed Dec. 20, 1979, and in the U.S. application for patent, Ser. No. 203981 filed Nov. 4, 1980, attorneys case No. P-80,1215, applicant ref. VPA 79 P 7817 USA, with further details which may be of interest, and via which a respective plurality of communication possibilities may be given in the manner initially explained. The cross point switches . . . 1kq, . . . pkt, . . . may be formed by means of linkage elements realized in ECL technology which, thereby, without this being illustrated in greater detail in the drawing, may be respectively combined in plurality on a chip in monolithic integration.

Proceeding therefrom that the individual broad band signal sources are not to be loaded with too low impedance and are, not to be loaded with circuit capacitances which are all too great, i.e., are not to be loaded by means of a randomly great number of directly connected cross point switches or, respectively, subscribers reached via these cross point switches, constantly unlocked ECL linkage elements of the type, for example, 10101 with a plurality of outputs, without or, respectively, with negation, are provided for the fanning out of the individual inputs El . . . Ep of the broad band switching network to the cross point switches appertaining to the respective input and leading to the various outputs of the broad band switching network. Thus, in the exemplary embodiment of a two-stage fanning out, the input El is connected to the cross point switch 1kt leading to the output At, being connected via the non-negating output of such a linkage element Fla and the non-negating output of a further linkage element Flb;

is connected to the cross point switch 1ks leading to the output

As, being connected via the non-negating output of the linkage element Fla and the negating output of the linkage element Flb;

is connected to the cross point switch 1kr leading to the output line Ar, being connected via the negating output of the linkage element Fla and the non-negating output of a further linkage element Flc; and is connected to the cross point switch 1kq leading to the output line Aq, being conneced via the negating output of the linkage element Fla and the negating output of the further linkage element Flc.

In an analogous manner, the input Ep of the broad band switching network is connected via linkage elements Fpa, Fpb, Fbc to cross point switches pkt, pks, pkr, pkq likewise leading to the said outputs At, As, Ar, Aq of the broad band switching network.

It is to be pointed out in this context that the said linkage elements . . . , Fla, . . . , Fpc, . . . need fundamentally exhibit only one input line and are also illustrated in the drawing with only a single input line, but can also have at least one further input line in addition, proceeding from which it is then constantly unlocked by means of the connection of a corresponding unlocking signal, i.e., are prepared for a signal transmission via the broad band signal path illustrated in the drawing.

Given the described exploitation of the outputs without negation as well as the outputs with negation, a pulse-modulated, preferably pulse code (PC) or pulse phase (PP) modulated broad band signal to be through-connected can be experienced a negation—under certain conditions, a multiple negation as well—on this path or not, depending upon whiich fan-out path leads from an input of the broad band switching network to a specific cross point switch. Thereby, under certain conditions, an uneven number of negations would have to be compensated by means of an additional negation. Expediently instead of that, however, and this is also shown in the drawing, those cross point switches in whose case the broad band signals have experienced $2n-2$ negations (with $n=1,2 \ldots$) in the said ECL linkage elements preconnected to the cross point switches in iterative network, on the one hand, and those cross point switches in whose case the broad band signals have experienced $2n-1$ negations (with $n=1,2 \ldots$) in the said ECL linkage elements preconnected to the cross point switches in iterative network, on the other hand, are formed by means of ECL linkage elements (AND, NOR) with linkage functions interchanged with one another with respect to the pulse modulated broad band signals. Thereby, what is meant by an interchange of the linkage function with respect to the pulse-modulated broad band signals is an interchange of the two values of the input variables in the truth or, respectively, function table of the linkage elements, said input variables corresponding to the broad band signals. Thus, the cross point switches 1kt . . . pkt and 1kq . . . pkq in whose case the broad band signals have experienced no or, respectively, two negations on their path proceeding from the input E1 or, respectively, Ep are formed by AND elements of, for example, the type 10104; the cross point switches 1ks . . . pks and 1kr . . . pkr in whose case the broad band signals have experienced one negation (or, respectively, an uneven number of negations) on their path proceeding from the input El . . . Ep are, in contrast thereto, formed by NOR elements of, for example, the type 10102. Given such a realization with AND and NOR elements, moreover, the linkage functions are not only interchanged with one another with respect to the pulse-modulated broad band signals but, rather, also with respect to the control signals to be supplied to the cross point switches via their drive lines, which means that the control signals are to be supplied negated to the control inputs s of the cross point switches formed by the NOR elements.

The drive lines s or, respectively, s of the cross point switches . . . , 1kq, . . . pkt . . . , without this being illustrated in the drawing in yet greater detail, can be connected to the individual outputs of a drive decoder respectively allocated to a series of cross point switches, for example, the cross point switches 1kt . . . pkt, the individual cross point switches being respectively made conductive pulse-wise proceeding from said drive decoder by means of control pulses supplied at the proper times.

It will be apparent that many modifications and variations may be effected without departing from the scope of the novel concepts and teachings of the present invention.

I claim as by invention:

1. A broad band switching network for pulse-modulated broad band signals, said switching network comprising coupling point circuits in ECL technology, constantly unlocked ECL linkage elements (Fpa, Fpb, Fpc) with a plurality of outputs with or, respectively, without negation being provided for the connection of the individual inputs (El . . . Ep) of the switching network to the coupling point circuits, said coupling point circuits comprising coupling point switches ( . . . , pkq, . . . , pkt, . . .) appertaining to the respective input (Ep) and leading to the various outputs ( . . . , Ag, . . . , At, . . . ) of the switching network, the coupling point switches (pkt,pkq) in which case the broad band signals experience $2n-2$ negations (with $n=1,2, \ldots$) in said ECL linkage elements (Fpa, Fpb; Fpa, Fpc) which are preconnected to the cross point switches (pkt, pkq) in iterative network, on the one hand, and the coupling point switches (pkr,pks) in whose case the broad band signals experience $2n-1$ negations (with $n=1,2, \ldots$) in said ECL linkage elements (Fpa, Fpc; Fpa, Fpb) which are preconnected to the coupling point switches (pkr, pks) in iterative network, on the other hand, being formed by means of ECL linkage elements (AND, NOR) with linkage functions which are interchanged with one another with respect to the pulse-modulated broad band signals.

2. A broad band switching network according to claim 1, characterized in that the coupling point switches are formed by means of AND elements and by means of NOR elements.

* * * * *